(12) United States Patent
Suginobu

(10) Patent No.: US 10,290,318 B2
(45) Date of Patent: May 14, 2019

(54) MOTOR AND DISK DRIVE APPARATUS INCLUDING A WIRE PASSING FROM A STATOR THROUGH A BASE FIRST ANNULAR PORTION HOLE AND SOLDERED TO A CIRCUIT BOARD LAND PORTION

(71) Applicant: Nidec Corporation, Kyoto (JP)

(72) Inventor: Shingo Suginobu, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 15/924,541

(22) Filed: Mar. 19, 2018

(65) Prior Publication Data

US 2018/0336926 A1   Nov. 22, 2018

(30) Foreign Application Priority Data

May 16, 2017  (JP) ................. 2017-096935

(51) Int. Cl.
| | | |
|---|---|---|
| *G11B 19/20* | (2006.01) | |
| *G11B 33/12* | (2006.01) | |
| *H02K 3/50* | (2006.01) | |
| *H05K 1/11* | (2006.01) | |
| *H05K 1/02* | (2006.01) | |

(Continued)

(52) U.S. Cl.
CPC ...... *G11B 19/2045* (2013.01); *G11B 19/2009* (2013.01); *G11B 33/122* (2013.01); *G11B 33/124* (2013.01); *H02K 3/38* (2013.01); *H02K 3/50* (2013.01); *H02K 5/22* (2013.01); *H02K 11/33* (2016.01); *H05K 1/028* (2013.01); *H05K 1/111* (2013.01); *H02K 1/2786* (2013.01); *H02K 5/1677* (2013.01); *H02K 5/1737* (2013.01); *H02K 2203/03* (2013.01); *H02K 2203/06* (2013.01); *H05K 2201/09072* (2013.01); *H05K 2201/09409* (2013.01); *H05K 2201/1009* (2013.01); *H05K 2201/10159* (2013.01); *H05K 2201/10287* (2013.01)

(58) Field of Classification Search
USPC ............................ 360/98.07, 99.08
See application file for complete search history.

(56) References Cited

U.S. PATENT DOCUMENTS

| | | | | |
|---|---|---|---|---|
| 6,097,121 A | * | 8/2000 | Oku ............... | G11B 19/2009 310/425 |
| 6,734,590 B2 | * | 5/2004 | Obara ............. | F16C 17/026 310/67 R |

(Continued)

*Primary Examiner* — Jefferson A Evans
(74) *Attorney, Agent, or Firm* — Keating & Bennett, LLP

(57) ABSTRACT

This motor includes a base and a circuit board arranged on a lower surface of the base. The base includes a first annular portion and a second annular portion. The first annular portion is arranged under a stator. The second annular portion is arranged under a flange portion of a hub. A conducting wire drawn out from the stator is arranged to pass through a through hole defined in the first annular portion, and is soldered to a land portion of the circuit board. The second annular portion is arranged to have an axial thickness smaller than that of the first annular portion. The land portion is arranged radially inward of the through hole. The above arrangement makes it easier to achieve a reduced axial dimension of the motor while ensuring a sufficient axial dimension of the hub, which is arranged axially above the second annular portion.

16 Claims, 6 Drawing Sheets

(51) Int. Cl.
   *H02K 5/22*     (2006.01)
   *H02K 3/38*     (2006.01)
   *H02K 11/33*    (2016.01)
   *H02K 1/27*         (2006.01)
   *H02K 5/167*        (2006.01)
   *H02K 5/173*        (2006.01)

(56) References Cited

U.S. PATENT DOCUMENTS

| | | | |
|---|---|---|---|
| 7,268,452 B2 | 9/2007 | Yoshino et al. | |
| 8,120,872 B2* | 2/2012 | Sekii | H02K 3/50 |
| | | | 310/67 R |
| 8,278,791 B2* | 10/2012 | Yamazaki | H02K 3/522 |
| | | | 310/71 |
| 2010/0143869 A1* | 6/2010 | Padros Fradera | A61C 8/005 |
| | | | 433/174 |
| 2011/0216442 A1* | 9/2011 | Uchibori | G11B 17/02 |
| | | | 360/99.08 |
| 2014/0085749 A1* | 3/2014 | Shinao | H02K 7/086 |
| | | | 360/99.08 |
| 2016/0078894 A1* | 3/2016 | Park | G11B 19/2009 |
| | | | 360/99.08 |

* cited by examiner

MOTOR AND DISK DRIVE APPARATUS INCLUDING A WIRE PASSING FROM A STATOR THROUGH A BASE FIRST ANNULAR PORTION HOLE AND SOLDERED TO A CIRCUIT BOARD LAND PORTION

CROSS REFERENCE TO RELATED APPLICATIONS

This application claims the benefit of priority to Japanese Patent Application No. 2017-096935 filed on May 16, 2017. The entire contents of this application are hereby incorporated herein by reference.

BACKGROUND OF THE INVENTION

1. Field of the Invention

The present invention relates to a motor and a disk drive apparatus.

2. Description of the Related Art

A hard disk drive typically has a spindle motor arranged to rotate a disk installed therein. Such a spindle motor includes a stationary portion fixed to a housing of an apparatus, and a rotating portion arranged to rotate while supporting the disk. The spindle motor is arranged to generate a torque centered on a central axis through magnetic flux generated between the stationary portion and the rotating portion, so that the rotating portion is caused to rotate with respect to the stationary portion.

A known spindle motor is described in, for example, JP-A 2011-114892. The spindle motor described in JP-A 2011-114892 includes a base member, coils, and a circuit board. An end portion of each of conducting wires defining the coils is drawn out downwardly of the base member through a through hole defined in the base member, and is soldered to the circuit board.

In recent years, the thickness of hard disk drives has been decreasing, and there has been a strong demand for an increased number of disks installed in a hard disk drive. Along with such demands, there is a need to secure a space for soldering a conducting wire to a circuit board below a lower surface of a base.

SUMMARY OF THE INVENTION

In the spindle motor described in JP-A 2011-114892, the conducting wires are soldered to the circuit board at positions radially outward of the through hole through which the conducting wires are drawn out. With this arrangement, however, solders are arranged under a disk or a hub arranged to support the disk. This makes it difficult to achieve an additional reduction in axial dimension of the motor while securing a space for the soldering and ensuring a sufficient axial dimension of the hub arranged to support the disk.

A motor according to a first preferred embodiment of the present invention includes a base arranged to be perpendicular to a central axis extending in a vertical direction; a stator arranged axially above the base; a hub supported to be rotatable about the central axis with respect to the base and the stator; a magnet arranged radially outside of the stator, and arranged to rotate together with the hub; and a circuit board arranged on a lower surface of the base. The hub includes a flange portion, at least a portion of the flange portion being arranged radially outward of and axially below the stator. The base includes a first annular portion arranged under the stator, and a second annular portion arranged under the flange portion. The second annular portion is arranged to have an axial thickness smaller than that of the first annular portion. The first annular portion includes a through hole arranged to pass therethrough in an axial direction. The circuit board includes at least one land portion arranged radially inward of the through hole. A conducting wire drawn out from the stator is arranged to pass through the through hole, and is soldered to a corresponding one of the at least one land portion.

According to the first preferred embodiment of the present invention, the second annular portion arranged under the flange portion is arranged to have a reduced axial thickness, and the at least one land portion is arranged radially inward of the through hole. This arrangement makes it easier to achieve a reduced axial dimension of the motor while ensuring a sufficient axial dimension of the hub, which is arranged axially above the second annular portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings. It is assumed herein that a direction parallel to a central axis of a spindle motor is referred to by the term "axial direction", "axial", or "axially", that directions perpendicular to the central axis of the spindle motor are each referred to by the term "radial direction", "radial", or "radially", and that a direction along a circular arc centered on the central axis of the spindle motor is referred to by the term "circumferential direction", "circumferential", or "circumferentially". It is also assumed herein that an axial direction is a vertical direction, and that a side on which a stator is arranged with respect to a base is defined as an upper side. The shape of each member or portion and relative positions of different members or portions will be described based on the above assumptions. Note, however, that the above definitions of the vertical direction and the upper and lower sides are simply made for the sake of convenience in description, and should not be construed to restrict the orientation of a motor or a disk drive apparatus according to any preferred embodiment of the present invention at the time of manufacture or when in use.

Also note that the term "parallel" as used herein includes both "parallel" and "substantially parallel". Also note that the term "perpendicular" as used herein includes both "perpendicular" and "substantially perpendicular".

Figure 1:
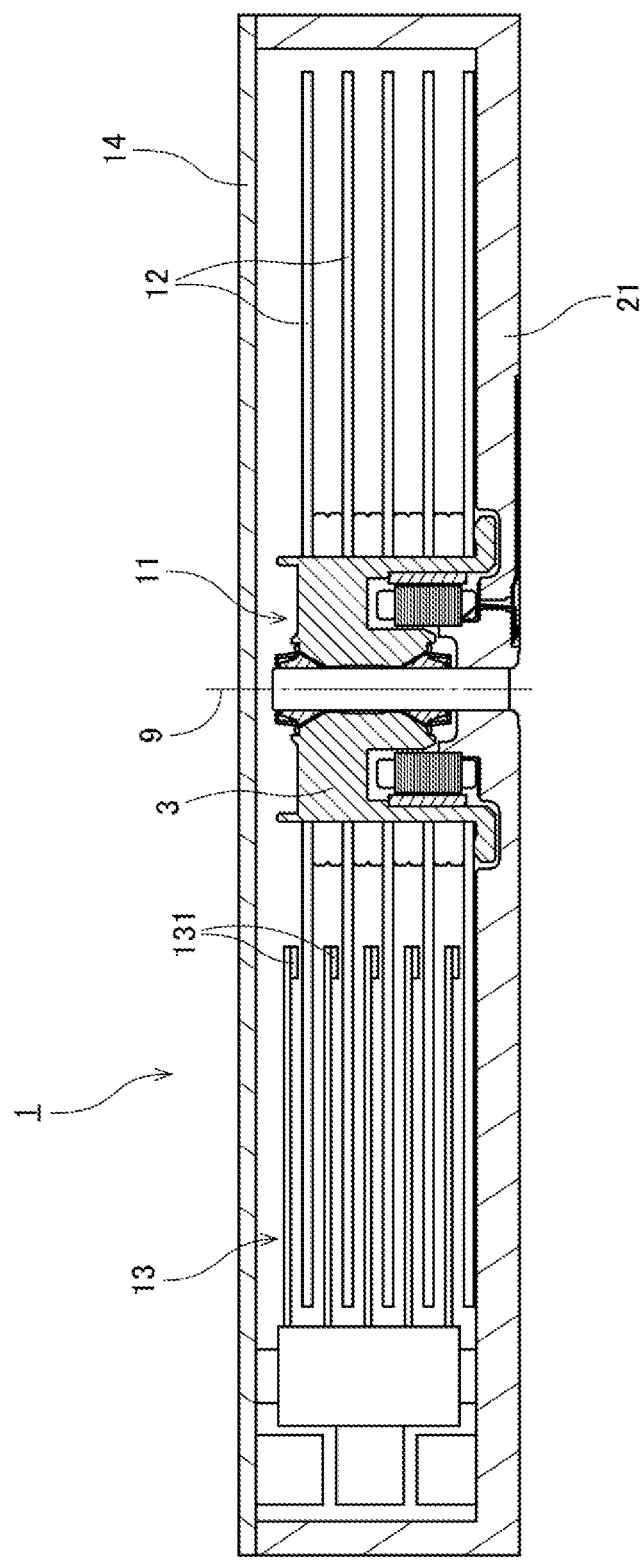
FIG. 1 is a vertical sectional view of a disk drive apparatus according to a preferred embodiment of the present invention.

FIG. 1 is a vertical sectional view of a disk drive apparatus 1 according to a preferred embodiment of the present invention. The disk drive apparatus 1 is an apparatus arranged to perform reading and writing of information from or to magnetic disks 12 while rotating the magnetic disks 12. As illustrated in FIG. 1, the disk drive apparatus 1 includes a spindle motor 11, the magnetic disks 12, which are five in number, an access portion 13, and a cover 14.

The spindle motor 11 is arranged to rotate the five magnetic disks 12 about a central axis 9 while supporting the magnetic disks 12. The cover 14 is arranged to cover an upper side of the spindle motor 11, the five magnetic disks 12, and the access portion 13. An outer edge portion of the cover 14 is fixed to an outer edge portion of a base 21 of the spindle motor 11. A rotating portion 3 of the spindle motor 11, the five magnetic disks 12, and the access portion 13 are accommodated in a casing defined by the cover 14 and the base 21 of the spindle motor 11. The access portion 13 is arranged to move heads 131 along recording surfaces of the magnetic disks 12 to read and write information from or to the magnetic disks 12.

A junction of the base 21 and the cover 14 is sealed by a sealant, such as, for example, an elastomer. In addition, an interior of the casing defined by the base 21 and the cover 14 is filled with helium, hydrogen, a gas mixture of helium and hydrogen, or a gas mixture of any one of the above and air. Each of the above gases has a density lower than that of air outside of the casing. This leads to a reduction in viscous drag applied to each of the magnetic disks 12 and the access portion 13 while the disk drive apparatus 1 is running.

Note that the disk drive apparatus 1 may alternatively be arranged to have one, two, three, four, or more than five magnetic disks 12. Also note that the access portion 13 may alternatively be arranged to perform only one of the reading and the writing of information from or to the magnetic disk(s) 12.

Figure 2:
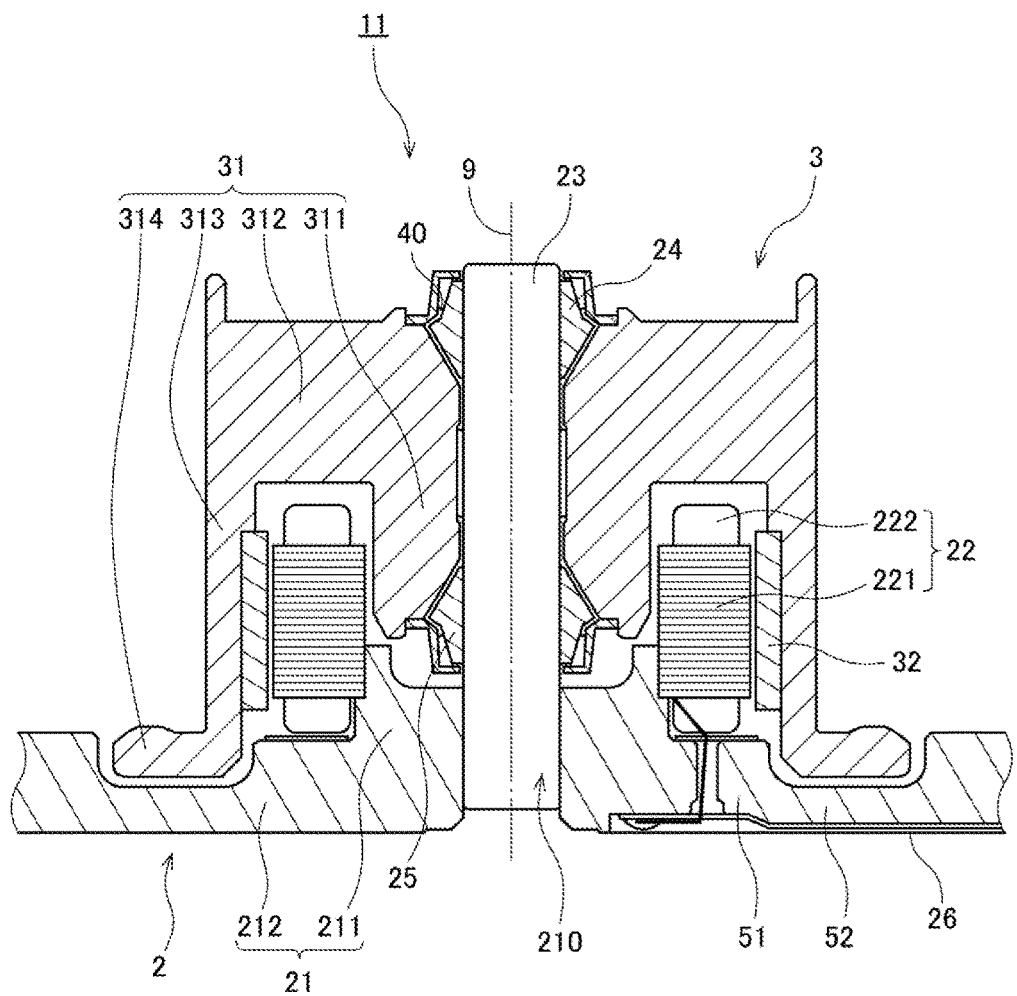
FIG. 2 is a vertical sectional view of a spindle motor according to a preferred embodiment of the present invention.

Next, the structure of the above-described spindle motor 11 will now be described below. FIG. 2 is a vertical sectional view of the spindle motor 11. Referring to FIG. 2, the spindle motor 11 includes a stationary portion 2 and the rotating portion 3. The stationary portion 2 is arranged to be stationary relative to both the base 21 and the cover 14. The rotating portion 3 is supported to be rotatable with respect to the stationary portion 2.

The stationary portion 2 according to the present preferred embodiment includes the base 21, a stator 22, a shaft 23, an upper annular member 24, a lower annular member 25, and a circuit board 26.

The base 21 is arranged to support the stator 22. The base 21 is obtained by, for example, casting of an aluminum alloy. Referring to FIG. 2, the base 21 includes a center hole 210, a holder portion 211, and a bottom plate portion 212. The center hole 210 is arranged to pass through the base 21 in an axial direction at a position overlapping with the central axis 9. The holder portion 211 is arranged to extend in the axial direction around the center hole 210. The holder portion 211 includes a cylindrical inner circumferential surface centered on the central axis 9. The bottom plate portion 212 is arranged to extend radially outward from the holder portion 211. That is, the base 21 is arranged to be perpendicular to the central axis 9. The stator 22, a flange portion 314, which will be described below, a rotor magnet 32, the magnetic disks 12, and the access portion 13 are arranged axially above the bottom plate portion 212.

The stator 22 includes a stator core 221 and a plurality of coils 222. The stator core 221 is defined by, for example, laminated steel sheets, that is, electromagnetic steel sheets, such as silicon steel sheets, placed one upon another in the axial direction. The stator core 221 is fixed to an outer circumferential surface of the holder portion 211. In addition, the stator core 221 includes a plurality of teeth arranged to project radially outward. Each coil 222 is defined by a conducting wire 60 wound around a separate one of the teeth.

The shaft 23 is a columnar member arranged to extend along the central axis 9. A lower end portion of the shaft 23 is inserted into the center hole 210 of the base 21, and is fixed to the holder portion 211. A metal, such as stainless steel, for example, is used as a material of the shaft 23. An upper end portion of the shaft 23 may be fixed to the cover 14 of the disk drive apparatus 1.

Each of the upper and lower annular members 24 and 25 is a member in the shape of a circular ring and fixed to the shaft 23. The upper annular member 24 is fixed to an outer circumferential surface of the shaft 23 in the vicinity of the upper end portion of the shaft 23. The lower annular member 25 is fixed to the outer circumferential surface of the shaft 23 at a position axially below and spaced from that of the upper annular member 24.

The circuit board 26 is attached to a lower surface of the base 21. The circuit board 26 has an electrical circuit arranged to supply electric drive currents to the coils 222. The circuit board 26 is electrically connected to the conducting wires 60 defining the coils 222. In the present preferred embodiment, a flexible printed circuit (FPC) board is used as the circuit board 26. The flexible printed circuit board is flexibly bendable. Accordingly, the circuit board 26 can be arranged in accordance with the shape of the lower surface of the base 21. In addition, the circuit board 26 can be arranged to have a reduced axial thickness, which leads to a reduced axial dimension of the spindle motor 11.

The rotating portion 3 according to the present preferred embodiment includes a hub 31 and the rotor magnet 32.

The hub 31 is a member in the shape of a circular ring and supported to be rotatable about the central axis 9. The hub 31 includes a sleeve portion 311, a disk-shaped portion 312, a cylindrical portion 313, and the flange portion 314. The sleeve portion 311 is a cylindrical portion arranged to extend in the axial direction around the shaft 23. The sleeve portion 311 is arranged opposite to each of the shaft 23 and the upper and lower annular members 24 and 25 with a slight gap therebetween. In addition, a lubricating oil 40 is arranged in the gap between the sleeve portion 311 and each of the shaft 23 and the upper and lower annular members 24 and 25. Thus, the rotating portion 3, which includes the hub 31, is supported to be rotatable with respect to the stationary portion 2, which includes the base 21, the stator 22, the shaft 23, and the upper and lower annular members 24 and 25.

The disk-shaped portion 312 is arranged to extend radially outward from an upper end of the sleeve portion 311. The cylindrical portion 313 is arranged to extend axially downward from an outer end of the disk-shaped portion 312. The flange portion 314 is arranged to extend radially outward from a lower end of the cylindrical portion 313. At least a portion of an inner circumferential portion of each of the magnetic disks 12 is arranged to be in contact with an outer circumferential surface of the cylindrical portion 313. In addition, at least a portion of a lower surface of a lowermost one of the magnetic disks 12 is arranged to be in contact with an upper surface of the flange portion 314. The magnetic disks 12 are thus supported, with each magnetic disk 12 being positioned radially and axially.

The rotor magnet 32 is fixed to an inner circumferential surface of the cylindrical portion 313 of the hub 31. Accordingly, the rotor magnet 32 is arranged to rotate together with the hub 31. The rotor magnet 32 is arranged radially outside of the stator 22. A magnet in the shape of a circular ring, for example, is used as the rotor magnet 32. An inner circumferential surface of the rotor magnet 32 is arranged radially opposite to each of the teeth of the stator core 221. In addition, the inner circumferential surface of the rotor magnet 32 includes north and south poles arranged to alternate with each other in a circumferential direction. Note that the rotor magnet 32 may alternatively be fixed to the hub 31 with a yoke made of a magnetic material interposed therebetween. Also note that a plurality of magnets arranged in a circular ring may be used in place of the magnet in the shape of a circular ring.

Once the electric drive currents are supplied from the circuit board 26 to the coils 222 in the spindle motor 11 as described above, radial magnetic flux is generated around each of the teeth of the stator core 221. Then, a circumferential torque is produced by interaction between the magnetic flux of the teeth and that of the rotor magnet 32, so that the rotating portion 3 is caused to rotate about the central axis 9 with respect to the stationary portion 2. The magnetic disks 12 supported by the hub 31 are caused to rotate about the central axis 9 together with the rotating portion 3.

Figure 3:
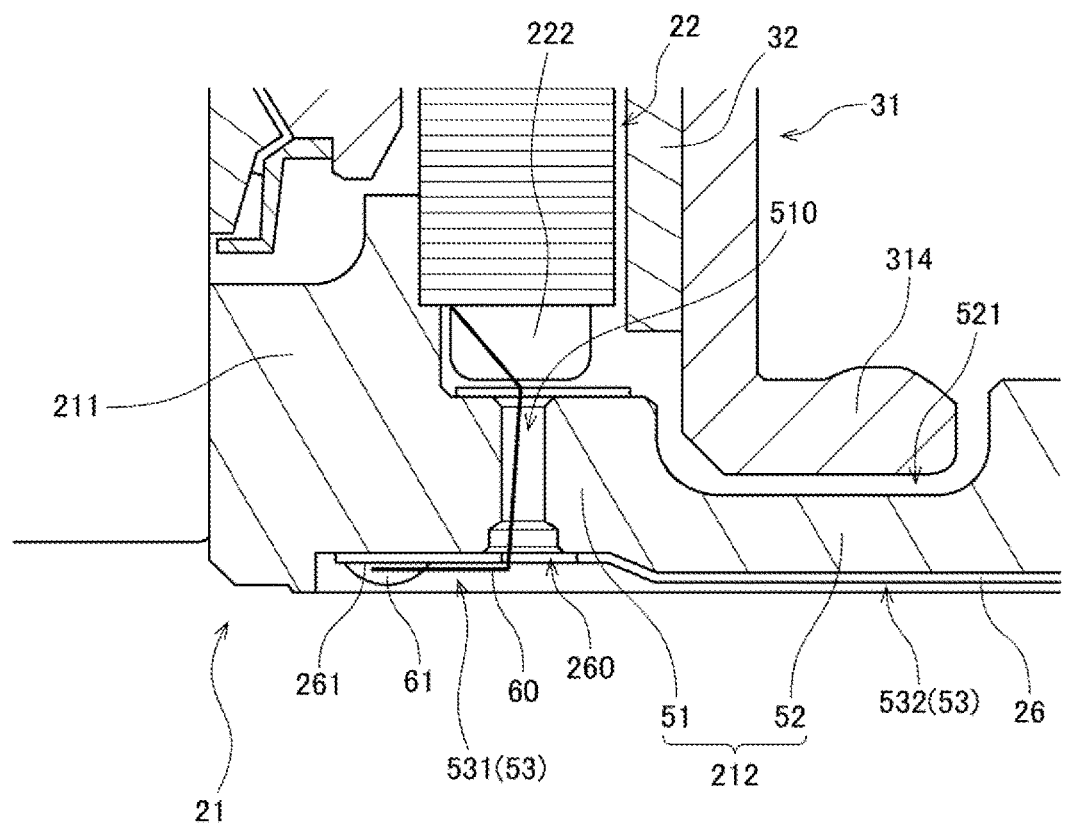
FIG. 3 is a partial vertical sectional view of the spindle motor.
Figure 4:
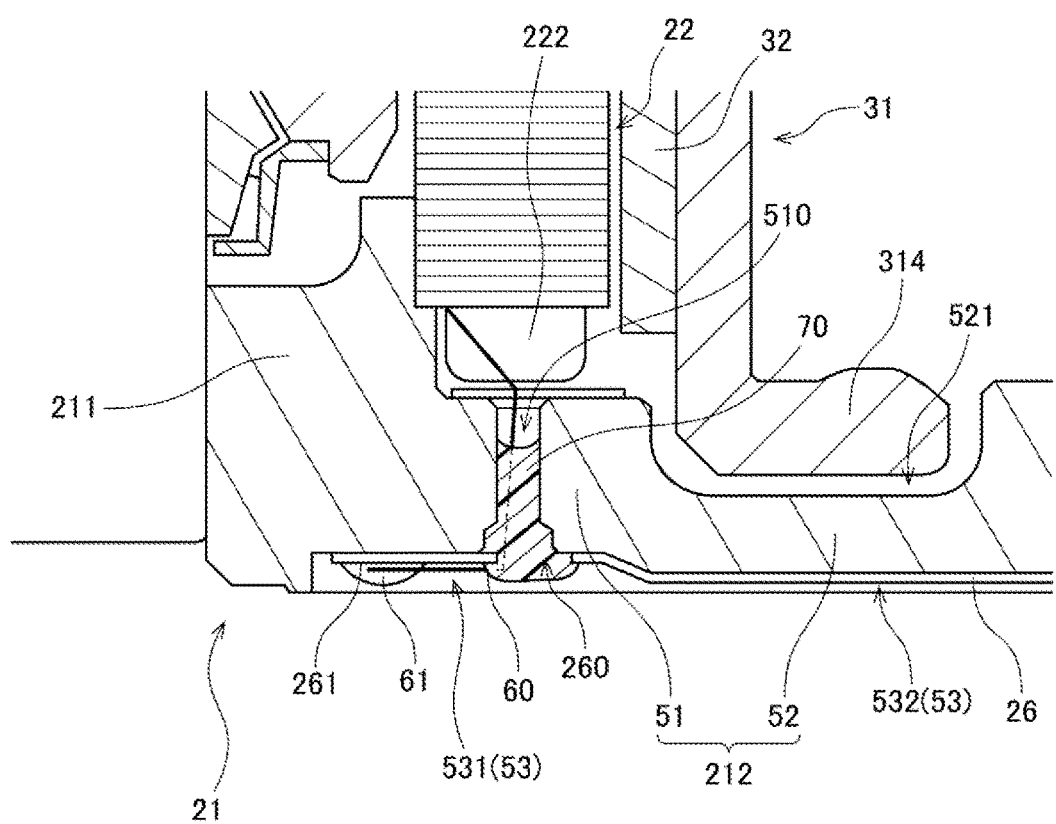
FIG. 4 is a partial vertical sectional view of the spindle motor.
Figure 5:
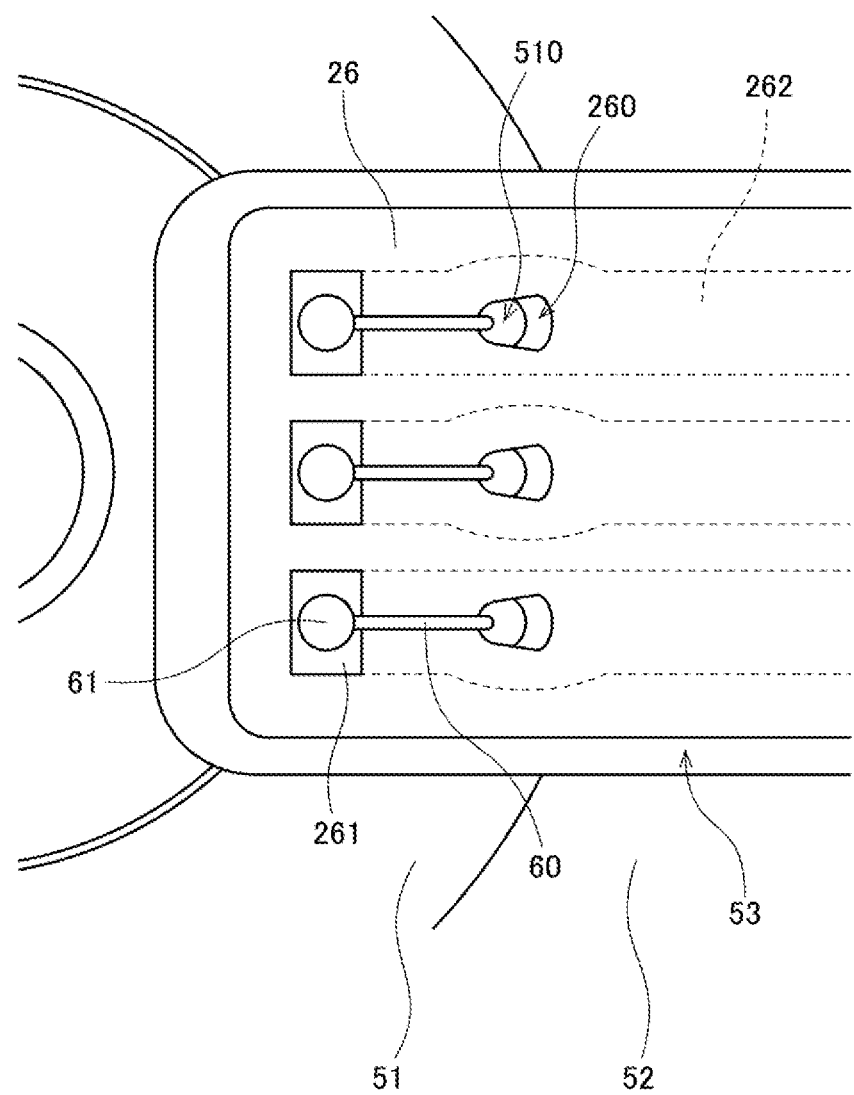
FIG. 5 is a partial bottom view of the spindle motor.

Next, the structure of the base 21 will now be described in more detail below. Each of FIGS. 3 and 4 is a partial vertical sectional view of the spindle motor 11. FIG. 3 illustrates a state of the spindle motor 11 before an adhesive 70 is put into through holes 510, which will be described below. FIG. 4 illustrates a state of the spindle motor 11 after the adhesive 70 is put into the through holes 510, which will be described below. FIG. 5 is a partial bottom view of the spindle motor 11.

Referring to FIGS. 2 to 5, the bottom plate portion 212 of the base 21 includes a first annular portion 51 in the shape of a circular ring, and a second annular portion 52 in the shape of a circular ring. The first annular portion 51 is arranged under the stator 22. The second annular portion 52 is arranged under the flange portion 314 of the hub 31. The first annular portion 51 includes three of the through holes 510. The three through holes 510 are arranged in the circumferential direction. Each through hole 510 is arranged to pass through the first annular portion 51 in the axial direction.

The spindle motor 11 according to the present preferred embodiment is a three-phase synchronous motor. The coils 222 are defined by three conducting wires 60 each of which is used to carry an electric current for a separate one of a U phase, a V phase, and a W phase. The circuit board 26 includes three opening portions 260 and three land portions 261. The three opening portions 260 are arranged in the circumferential direction. Each of the three opening portions 260 is arranged to overlap with a separate one of the through holes 510. Each opening portion 260 is arranged to pass through the circuit board 26 in the axial direction.

Each land portion 261 is a portion where a lead portion (i.e., a copper foil) 262 defined by a conductor within the circuit board 26 is exposed. The three land portions 261 are arranged in the circumferential direction. Each of the three land portions 261 is arranged radially inside of the corresponding through hole 510 and the corresponding opening portion 260. Referring to FIGS. 3 to 5, each of the conducting wires 60 defining the coils 222 is drawn out from one of the coils 222 downwardly of the base 21 through the corresponding through hole 510 and the corresponding opening portion 260. An end portion of each conducting wire 60 is then soldered to the corresponding land portion 261.

In addition, referring to FIGS. 3 and 4, a recessed portion 521 in the shape of a circular ring is defined in an upper surface of the base 21. The recessed portion 521 is recessed axially downward in an upper surface of the second annular portion 52. Thus, the upper surface of the second annular portion 52 is arranged axially below an upper surface of the first annular portion 51. As a result, the second annular portion 52 is arranged to have an axial thickness smaller than that of the first annular portion 51. At least a portion of the flange portion 314 of the hub 31 is arranged radially outward of and axially below the stator 22. Then, this portion of the flange portion 314 is accommodated in the recessed portion 521.

As described above, in this spindle motor 11, the second annular portion 52 is arranged to have an axial thickness smaller than that of the first annular portion 51. The reduced axial thickness of the second annular portion 52 contributes to ensuring a sufficient axial dimension of the cylindrical portion 313 of the hub 31, which is arranged over the second annular portion 52. This in turn contributes to ensuring a sufficient maximum number of magnetic disks 12 that can be mounted on the hub 31. In addition, in this spindle motor 11, the land portions 261 are arranged radially inward of the through holes 510 defined in the first annular portion 51. This eliminates the need to provide a space for soldering under a lower surface of the second annular portion 52. This in turn leads to an additional reduction in the axial dimension of the spindle motor 11.

In addition, referring to FIGS. 3 to 5, a groove portion 53 is defined in the lower surface of the base 21. The groove portion 53 is recessed axially upward in the lower surface of the base 21. The groove portion 53 is arranged to extend in a radial direction over both a lower surface of the first annular portion 51 and the lower surface of the second annular portion 52. The circuit board 26 is arranged in the groove portion 53. Thus, the circuit board 26 is prevented from protruding downward relative to a lowermost surface of the base 21.

In particular, the groove portion 53 according to the present preferred embodiment includes a first groove portion 531 and a second groove portion 532. The first groove portion 531 is arranged radially inward of the through holes 510 in the lower surface of the base 21. The second groove portion 532 is defined in the lower surface of the second annular portion 52. The first groove portion 531 is arranged to have an axial depth greater than that of the second groove portion 532. A portion of the conducting wire 60 which has been drawn out through each through hole 510 is accommodated in the first groove portion 531. Then, the end portion of each conducting wire 60 is soldered to the corresponding land portion 261 in the first groove portion 531. The greater depth of the first groove portion 531 prevents the conducting wire 60 and a solder 61 attached to the land portion 261 from protruding downward relative to the lowermost surface of the base 21.

In addition, arranging the depth of the second groove portion 532 to be smaller than that of the first groove portion 531 prevents the axial thickness of the second annular portion 52 from becoming excessively small. This leads to ensuring a sufficient rigidity of the second annular portion 52.

As illustrated in FIG. 4, the adhesive 70 is put into each of the through holes 510 and the opening portions 260. Each of the through holes 510 and the opening portions 260 is thus sealed. That is, a communication between an interior space of the disk drive apparatus 1 and a space below the base 21 through any of the through holes 510 and the opening portions 260 is prevented. This contributes to preventing a leakage of the low-density gas out of the disk drive apparatus 1.

Three of the lead portions 262, which are used for the U, V, and W phases, respectively, are arranged within the circuit board 26. In FIG. 5, each lead portion 262 is represented by a broken line. Each lead portion 262 is arranged to extend radially outward from the corresponding land portion 261. As illustrated in FIG. 5, in the present preferred embodiment, each opening portion 260 is arranged to pass through a portion of the corresponding lead portion 262 in the axial direction. A portion of each lead portion 262 is arranged to extend radially outward along an edge of the corresponding opening portion 260. Thus, each lead portion 262 extends radially outward beyond the opening portions 260 while avoiding the opening portions 260 and avoiding an excessive increase in circumferential width.

While a preferred embodiment of the present invention has been described above, it is to be understood that the present invention is not limited to the above-described preferred embodiment.

Figure 6:
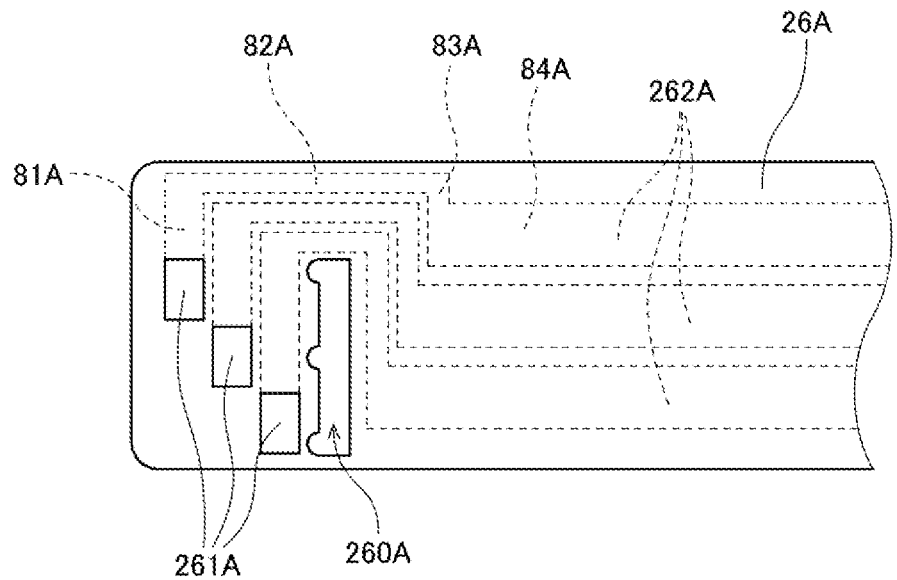
FIG. 6 is a plan view of a circuit board according to a modification of the above preferred embodiment of the present invention.

FIG. 6 is a plan view of a circuit board 26A according to a modification of the above-described preferred embodiment. In the modification illustrated in FIG. 6, the circuit board 26A includes a single opening portion 260A and three land portions 261A. The opening portion 260A is arranged to pass through the circuit board 26A in the axial direction and extend in the circumferential direction. The three land portions 261A are arranged radially inside of the opening portion 260A. Three conducting wires defining a plurality of coils are drawn out downwardly of a base through three through holes defined in the base and the single opening portion 260A of the circuit board 26A. Then, an end portion of each conducting wire is connected to a corresponding one of the three land portions 261A through soldering.

In the modification illustrated in FIG. 6, each of three lead portions 262A includes a first lead portion 81A, a second lead portion 82A, a third lead portion 83A, and a fourth lead portion 84A. The first lead portion 81A is arranged to extend to one circumferential side from the corresponding land portion 261A. The second lead portion 82A is arranged to extend radially outward from an end portion of the first lead portion 81A on the one circumferential side. The third lead portion 83A is arranged to extend to another circumferential side from a radially outer end portion of the second lead portion 82A. The fourth lead portion 84A is arranged to extend radially outward from an end portion of the third lead portion 83A on the other circumferential side.

That is, in the modification illustrated in FIG. 6, all the three lead portions 262A are arranged to reach an area radially outward of the opening portion 260A, passing on the one circumferential side of the opening portion 260A. This arrangement allows each lead portion 262A to extend from the corresponding land portion 261A to the area radially outward of the opening portion 260A while avoiding the opening portion 260A.

In addition, in the modification illustrated in FIG. 6, each of the three land portions 261A is arranged not only at a different circumferential position but also at a different radial position. This arrangement contributes to preventing each land portion 261A from restricting the size of any other land portion 261A. This leads to an increased area of each land portion 261A. This in turn leads to improved workability and reliability of the soldering of the conducting wires to the land portions 261A.

Figure 7:
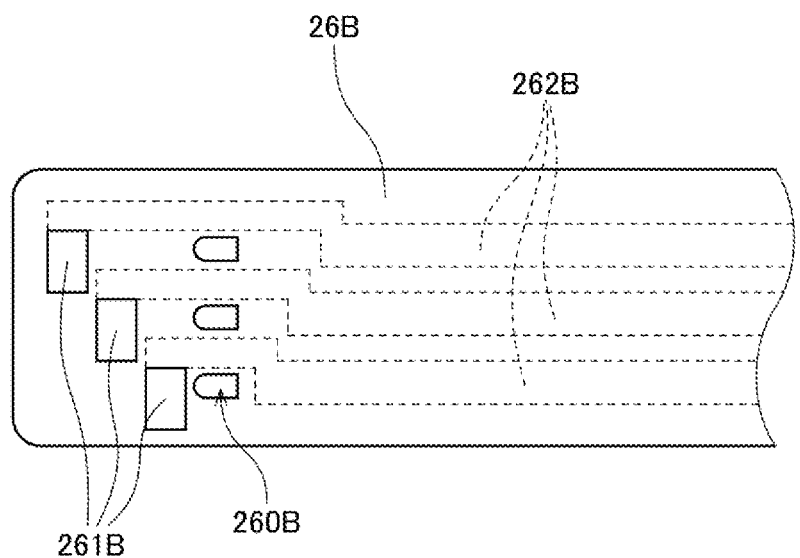
FIG. 7 is a plan view of a circuit board according to another modification of the above preferred embodiment of the present invention.

FIG. 7 is a plan view of a circuit board 26B according to another modification of the above-described preferred embodiment. In the modification illustrated in FIG. 7, the circuit board 26B includes three opening portions 260B and three land portions 261B. The three opening portions 260B are arranged in the circumferential direction. In addition, each opening portion 260B is arranged to pass through the circuit board 26B in the axial direction. Each of the three land portions 261B is arranged radially inside of the corresponding opening portion 260B. One conducting wire is arranged to pass through each opening portion 260B. Then, three conducting wires, each of which is drawn out through a separate one of the three opening portions 260B, are connected to the three land portions 261B through soldering.

In addition, in the modification illustrated in FIG. 7, each of lead portions 262B extending from the respective land portions 261B is arranged to extend to an area radially outward of the opening portions 260B through a position adjacent to the corresponding opening portion 260B on one circumferential side. Accordingly, as illustrated in FIG. 7, the opening portions 260B and the lead portions 262B are arranged to alternate with each other in the circumferential direction. This arrangement allows each lead portion 262B to extend from the corresponding land portion 261B to the area radially outward of the opening portions 260B while avoiding the opening portions 260B.

In addition, in the modification illustrated in FIG. 7, each of the three land portions 261B is arranged not only at a different circumferential position but also at a different radial position. This arrangement contributes to preventing each land portion 261B from restricting the size of any other land portion 261B. This leads to an increased area of each land portion 261B. This in turn leads to improved workability and reliability of the soldering of the conducting wires to the land portions 261B.

In each of the above-described preferred embodiment and the modifications thereof, the number of conducting wires drawn out from the stator is three. Note, however, that the number of conducting wires drawn out from the stator may alternatively be one, two, or more than three. Also note that the number of through holes defined in the base, the number of opening portions defined in the circuit board, and the number of land portions are not limited to the numbers according to the above-described preferred embodiment and the modifications thereof.

In addition, the motor according to the above-described preferred embodiment is a so-called fixed-shaft motor in which a shaft belongs to a stationary portion. Note, however, that a motor according to another preferred embodiment of the present invention may be a so-called rotating-shaft motor in which a shaft belongs to a rotating portion.

In addition, in the above-described preferred embodiment, a conical gap extending at an angle with respect to the central axis is defined between the stationary and rotating portions, and the lubricating oil is arranged in the conical gap. Note, however, that a radial gap and an axial gap may alternatively be defined between the stationary and rotating portions, with the lubricating oil being arranged in the radial and axial gaps. Also note that a bearing of another type, such as, for example, a ball bearing, may be used instead of a so-called fluid dynamic bearing using the lubricating oil.

Preferred embodiments of the present invention are applicable to, for example, motors and disk drive apparatuses.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A motor comprising:
a base arranged to be perpendicular to a central axis extending in a vertical direction;
a stator arranged axially above the base;
a hub supported to be rotatable about the central axis with respect to the base and the stator;
a magnet arranged radially outside of the stator, and arranged to rotate together with the hub; and
a circuit board arranged on a lower surface of the base; wherein
the hub includes a flange portion, at least a portion of the flange portion being arranged radially outward of and axially below the stator;
the base includes:
a first annular portion arranged under the stator; and
a second annular portion arranged under the flange portion;
the second annular portion is arranged to have an axial thickness smaller than that of the first annular portion;
the first annular portion includes a through hole arranged to pass therethrough in an axial direction;
the circuit board includes at least one land portion arranged radially inward of the through hole; and
a conducting wire drawn out from the stator is arranged to pass through the through hole, and is soldered to a corresponding one of the at least one land portion.

2. The motor according to claim 1, wherein an upper surface of the second annular portion is arranged axially below an upper surface of the first annular portion.

3. The motor according to claim 2, wherein
the base includes a recessed portion recessed axially downward in the upper surface of the second annular portion; and
a portion of the flange portion is accommodated in the recessed portion.

4. The motor according to claim 1, wherein
the base includes a groove portion recessed axially upward in the lower surface thereof;
the circuit board is arranged in the groove portion; and
the groove portion includes a first groove portion arranged radially inward of the through hole, and a second groove portion defined in a lower surface of the second annular portion, the first groove portion having an axial depth greater than that of the second groove portion.

5. The motor according to claim 1, wherein
the circuit board includes at least one opening portion arranged to pass therethrough in the axial direction; and
the conducting wire drawn out from the stator is arranged to pass through the through hole and a corresponding one of the at least one opening portion.

6. The motor according to claim 5, further comprising an adhesive arranged in the through hole and the at least one opening portion.

7. The motor according to claim 5, wherein
the circuit board further includes at least one lead portion arranged to extend from a corresponding one of the at least one land portion; and
the at least one lead portion is arranged to extend radially outward beyond the at least one opening portion while avoiding the at least one opening portion.

8. The motor according to claim 7, wherein a portion of the at least one lead portion is arranged to extend radially outward along an edge of a corresponding one of the at least one opening portion.

9. The motor according to claim 7, wherein the at least one opening portion is arranged to pass through a portion of a corresponding one of the at least one lead portion in the axial direction.

10. The motor according to claim 7, wherein
the at least one land portion includes a plurality of land portions;
the at least one opening portion included in the circuit board is one in number; and
a plurality of conducting wires are drawn out through the single opening portion, and are connected to the respective land portions.

11. motor according to claim 10, wherein
the at least one lead portion includes a plurality of lead portions arranged to extend from the respective land portions; and
all the lead portions are arranged to reach an area radially outward of the single opening portion, passing on one circumferential side of the single opening portion with respect to the central axis.

12. The motor according to claim 10, wherein each of the land portions is arranged at a different circumferential positions with respect to the central axis and a different radial positions.

13. The motor according to claim 7, wherein
the at least one land portion includes a plurality of land portions;
the at least one opening portion includes a plurality of opening portions; and
a plurality of conducting wires are drawn out through the respective opening portions, and are connected to the respective land portions.

14. The motor according to claim 13, wherein
the at least one lead portion includes a plurality of lead portions arranged to extend from the respective land portions; and
the lead portions and the opening portions are arranged to alternate with each other in a circumferential direction with respect to the central axis.

15. The motor according to claim 1, wherein the circuit board is a flexible board being flexibly bendable.

16. A disk drive apparatus comprising:
the motor of claim 1;
a disk supported by the hub;
an access portion arranged to perform at least one of reading and writing of information from or to the disk; and
a cover fixed to the base, and arranged to cover an upper side of the motor, the disk, and the access portion.

* * * * *